(12) United States Patent
Leigh et al.

(10) Patent No.: US 10,331,182 B2
(45) Date of Patent: Jun. 25, 2019

(54) HEAT EXCHANGERS

(71) Applicant: Hewlett Packard Enterprise Development LP, Houston, TX (US)

(72) Inventors: Kevin B. Leigh, Houston, TX (US); George D. Megason, Spring, TX (US); John Norton, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/747,170

(22) PCT Filed: Jul. 31, 2015

(86) PCT No.: PCT/US2015/043176
§ 371 (c)(1),
(2) Date: Jan. 24, 2018

(87) PCT Pub. No.: WO2017/023254
PCT Pub. Date: Feb. 9, 2017

(65) Prior Publication Data
US 2018/0217643 A1  Aug. 2, 2018

(51) Int. Cl.
*G06F 1/20* (2006.01)
*H05K 7/20* (2006.01)

(52) U.S. Cl.
CPC ............. *G06F 1/20* (2013.01); *H05K 7/202* (2013.01); *H05K 7/20254* (2013.01); *H05K 7/20272* (2013.01); *G06F 2200/201* (2013.01)

(58) Field of Classification Search
CPC ....... G06F 1/20; G06F 2200/201; H05K 7/20; H05K 7/20145; H05K 7/20154; H05K 7/20254; H05K 7/1092; H05K 7/20218–7/20281; H05K 7/20927; H05K 7/20327; H05K 7/20436; H05K 7/20409; H05K 3/303; H05K 3/308; H05K 2201/10121; H05K 2201/10325;
(Continued)

(56) References Cited

U.S. PATENT DOCUMENTS 6,437,437 B1 * 8/2002 Zuo ...................... F28D 15/0233
                                                              257/704
6,916,122 B2   7/2005 Branch
(Continued)

FOREIGN PATENT DOCUMENTS

JP           6252871 B2 * 1/2015 ............... H02G 3/16
KR        20130111258        10/2013

*Primary Examiner* — Dion Ferguson
*Assistant Examiner* — Amir A Jalali
(74) *Attorney, Agent, or Firm* — Hewlett Packard Enterprise Patent Department

(57) ABSTRACT

An example heat exchanger may comprise a base to thermally conductively engage with a computing component, a plurality of fins that may extend from the base on the same side as the computing component, and an auxiliary fluid channel defined by the plurality of fins. The plurality of fins may transfer thermal energy from the computing component to a fluid medium surrounding the plurality of fins. The auxiliary fluid channel may facilitate the transfer of thermal energy from an electronic component, other than the computing component, disposed within the auxiliary fluid channel to a fluid medium flowing through the auxiliary fluid channel.

9 Claims, 4 Drawing Sheets

(58) Field of Classification Search
CPC . H01L 23/427; H01L 23/467; H01L 23/3672; H01L 23/4087; H01L 23/473; H01L 23/42; H01L 23/44; H01L 23/46; H01L 23/4334; H01L 23/49568; H01L 24/83; H01L 21/02225; H01L 21/7076; H01L 2924/0002; H04B 10/40; F28D 1/024; F28D 1/0408; F28D 9/0234; F28D 15/00
USPC ........ 361/698–704, 711, 715, 719, 723, 695, 361/760, 764; 257/714, 722; 165/80.1–80.5, 104.33; 174/15.1, 16.3
See application file for complete search history.

(56) References Cited

U.S. PATENT DOCUMENTS

| | | | |
|---|---|---|---|
| 7,407,332 | B2 | 8/2008 | Oki |
| 7,804,867 | B2 | 9/2010 | Scofet |
| 8,414,309 | B2 | 4/2013 | Meadowcroft |
| 8,467,190 | B2 | 6/2013 | Yi |
| 8,599,559 | B1 | 12/2013 | Morrison |
| 8,830,679 | B2 | 9/2014 | Scholono |
| 2004/0188064 | A1* | 9/2004 | Upadhya ............... F04B 17/00 165/80.3 |
| 2005/0280993 | A1 | 12/2005 | Campbell |
| 2006/0144569 | A1* | 7/2006 | Crocker ................ F28F 3/12 165/104.33 |
| 2008/0043448 | A1* | 2/2008 | Finnerty ............... G06F 1/20 361/748 |
| 2009/0218078 | A1* | 9/2009 | Brunschwiler .......... G06F 1/20 165/104.33 |
| 2010/0085710 | A1* | 4/2010 | Bopp ................... B64D 43/00 361/697 |
| 2010/0328889 | A1* | 12/2010 | Campbell ......... H05K 7/20809 361/700 |
| 2011/0315343 | A1* | 12/2011 | Campbell ......... F28D 15/0233 165/80.3 |
| 2012/0007229 | A1 | 1/2012 | Bartley |
| 2013/0009168 | A1* | 1/2013 | Tsuchiya ............. H01L 23/473 257/77 |
| 2014/0158324 | A1* | 6/2014 | Tochiyama ........ H05K 7/20281 165/67 |
| 2014/0341580 | A1 | 11/2014 | Wang |
| 2015/0170989 | A1 | 6/2015 | Dhavaleswarapu |
| 2018/0006441 | A1* | 1/2018 | Sumida .................. H02G 3/16 |
| 2018/0139865 | A1* | 5/2018 | Draht ............... H05K 7/20254 |
| 2018/0204784 | A1* | 7/2018 | Kawase .............. H01L 23/473 |
| 2018/0217643 | A1* | 8/2018 | Leigh ..................... G06F 1/20 |
| 2018/0226735 | A1* | 8/2018 | Leigh ................... H01R 12/73 |

* cited by examiner

HEAT EXCHANGERS

BACKGROUND

Electronic devices may include electronic components, including computing components that may get hot, or increase in temperature, during use. The temperature of the electronic components may increase to such a degree that the temperature might inhibit optimal performance of the electronic component, cause unreliable operation of the electronic component, reduce usable lifetime of the electronic component, or even cause damage to the electronic component, nearby components, or the entire electronic device as a whole. Such electronic components may be coupled to heat transfer components in order to decrease, or regulate, the temperature of such a component to avoid damage or loss of performance quality. Such heat transfer components may include conductive or convective components, such as heat sinks or liquid cooling devices, which may enable thermal energy to be transferred from the electronic component to a fluid surrounding or flowing through or over the heat transfer component.

DETAILED DESCRIPTION

Figure 1A:
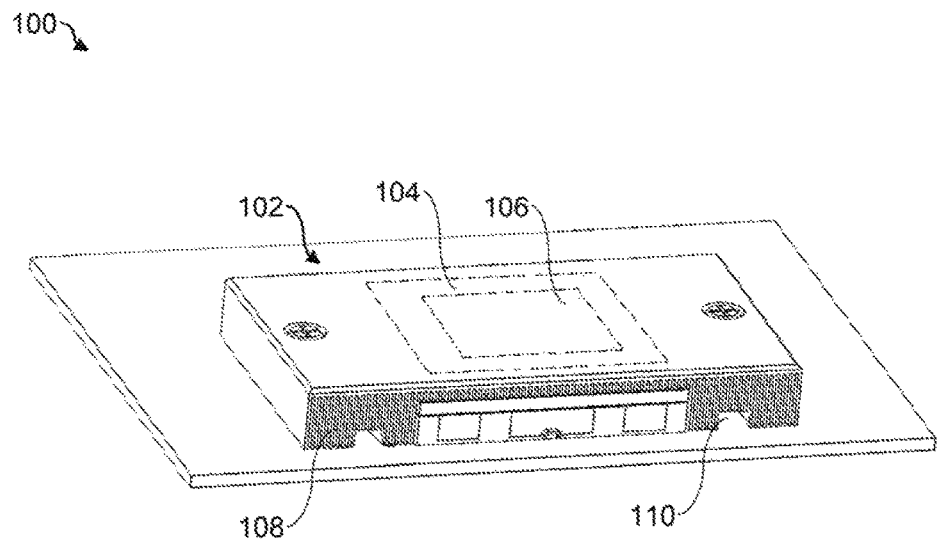
FIG. 1A is a perspective view of an example heat exchanger system having an example heat exchanger.

Electronic devices, such as computing devices, may include electronic components that may get hot, or increase in temperature, during use. The electronic components may be computing components, such as processors, integrated circuits, application-specific integrated circuits (ASIC's), or, further, may include optical components. The temperature of the electronic components may increase to such a degree that the temperature might inhibit optimal performance of the electronic component, cause unreliable operation of the electronic component, reduce usable lifetime of the electronic component, or even cause damage to the electronic component, nearby components, or the entire electronic device as a whole. Such electronic components may be coupled to heat transfer components in order to decrease, or regulate, the temperature of such a component to avoid damage or loss of performance quality. Such heat transfer components may include heat exchangers including conductive and/or convective components, such as heat sinks or liquid cooling devices, which may enable thermal energy to be transferred from the electronic component to a fluid surrounding or flowing through or over the heat transfer component.

In some situations, heat exchangers including heat sinks may be employed to remove thermal energy from an electronic component in order to decrease or regulate and manage its temperature, and, therefore maintain performance and avoid damage to the electronic component or others. Heat sinks may have a physical contact directly with the electronic component, or through another thermally conductive component or substance, such as a thermal grease or paste. This thermally conductive engagement with the electronic component may enable the conductive heat transfer of thermal energy from the electronic component to the heat sink. In order to dissipate this thermal energy, the heat sink may include fins or other protrusions designed and calculated to maximize the surface area of the heat sink, thus increasing the ability for the heat sink to transfer thermal energy to a fluid medium surrounding the heat sink, or flowing through or over the heat sink and the fins. In some situations, the fins may be relatively long to increase the heat transfer capabilities of the heat sink. The increased length of the fins of the heat sink may increase the volumetric space that the heat sink occupies within an electronic, or computer system. The fins may extend away from the electronic component in a substantially perpendicular manner. Additionally, the heat sink may be engaged with a fan or other device to push or pull a fluid medium through the fins of the heat sink, thereby increasing the heat transfer capabilities of the heat sink. The addition of the fan or fluid medium movement device may further increase the volumetric space required by the heat sink and fan system within an electronic, or computer system.

In some situations, it may be desirable to employ a heat exchanger including a heat sink to remove thermal energy from an electronic or computing component disposed within a computer system having a low profile envelope, or other tight volumetric limits. In such a situation, employing a heat sink having fins extending away from the electronic or computing component may not be possible due to size constraints of the computer system. Further, employing a heat sink that may be small enough to fit within the system envelope may not be successful in adequately cooling the computing component, due to the smaller surface area of the heat sink.

Additionally, in some situations, it may be desirable to employ a heat sink in a compact computer system having a low profile envelop wherein the heat sink may be disposed close to or near other electronic components that are not meant to be cooled by the heat sink. In other words, these other nearby electronic components may have a lower operating temperature than that of the electronic or computing component from which the heat sink is to transfer thermal energy. In such a situation, the heat sink may transfer the thermal energy drawn from the computing component to the other, nearby electronic components, thereby increasing the temperature of those components. The increased temperature of such nearby components may inhibit the proper or maximum performance of such components, or even damage such components.

Implementations of the present invention provide a heat exchanger to transfer thermal energy from an electronic component, and is suitable for use in a low-profile envelope computer system by including inverted heat transfer protrusions, or fins. Further, implementations of the present invention provide a heat exchanger that may be disposed near other electronic components that are not meant to be cooled by the heat exchanger. The heat exchangers described in the present disclosure may be disposed near such electronic components without transferring thermal energy to the nearby components to a degree which may be detrimental to the performance of, or damaging to, such nearby components.

Figure 1B:
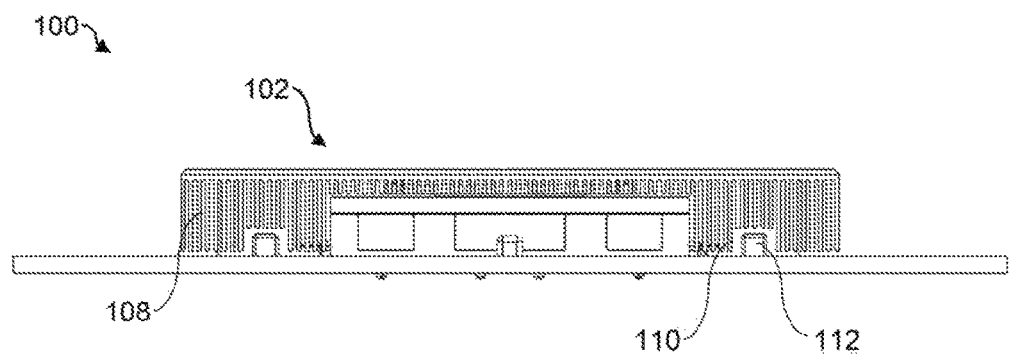
FIG. 1B is a front view of an example heat exchanger system having an example heat exchanger.

Referring now to FIGS. 1A-B, a perspective view and a front view of an example heat exchanger system 100 is illustrated. The example heat exchanger system 100 may include an example heat exchanger 102. The example heat exchanger 102 may include a base 104 to conductively engage with a computing component 106. In this figure, the base 104 is represented by phantom lines as it is not visible and is located on the underside of the heat exchanger 102. Similarly, the computing component 106 is also represented by phantom lines, as it is disposed underneath the heat exchanger 102, and has thermally conductive engagement with the base 104. In some implementations, the base 104 may be a surface on the underside of the heat exchanger 102, such that the heat exchanger 102 may be disposed on top of the computing component 106 to be cooled. Further, the base 104 may be a substantially flat surface, in some implementations, such that the base 104 may maintain thermally conductive engagement with a flat surface of the computing component 106. Additionally, in further implementations, the base 104 may have a surface profile or may be contoured to substantially match a surface on the computing component 106 such that the base 104 may maintain thermally conductive engagement with the computing component 106. It should be noted that, in this context, thermal conductive engagement may refer to a direct contact between the base 104 and the computing component 106 such that the computing component 106 may transfer thermal energy to the example heat exchanger 102 through the base. Additionally, thermally conductive engagement may refer to an indirect contact between the base 104, and the computing component 106, for example, through an intermediary substance, such as a thermal gel or paste, such that the computing component 106 may transfer thermal energy to the example heat exchanger 102 through the base 104.

The example heat exchanger 102 may further include a plurality of protrusions, or fins 108. The plurality of fins 108 may extend from the base on the same side as the computing component 106. In some implementations, the plurality of fins 108 may extend from the base 104 in a direction that is perpendicular or substantially perpendicular to the base 104. The plurality of fins may be conductively engaged with the base 104 such that the fins 108 may transfer thermal energy from the base 104 to a fluid medium surrounding the fins 108, or flowing over or through the fins 108. Each of the plurality of fins 108 may be spaced apart from the adjacent fins 108 such that a fluid medium may be present in between each of the plurality of fins 108, or flow in between each of the plurality of fins 108. As such, the plurality of fins 108 may transfer thermal energy from the computing component 106 to the fluid medium. In some implementations, the plurality of fins 108 and the base 104 may be constructed out of a unitary piece of material, or the plurality of fins 108 may be a separate component that is mechanically fastened to the base 104, in other implementations. The plurality of fins 108 may be formed separate from the base 104, and then soldered to the base, in further implementations. The plurality of fins 108 and the base 104 may both be constructed out of a thermally conductive material. In some implementations, the plurality of fins 108 and the base 104 may be constructed of aluminum, or an aluminum alloy, copper, or some other type of metal.

The computing component 106 may be an electrical or electronic component. In some implementations, the computing component 106 may be a processor or another component capable of processing logic or executing machine-readable instructions. In further implementations, the computing component 106 may be an integrated circuit, or an application-specific integrated circuit (ASIC), such as a network switch ASIC, and may be disposed on a circuit board within a computing device, such as a server or server rack.

Figure 1C:
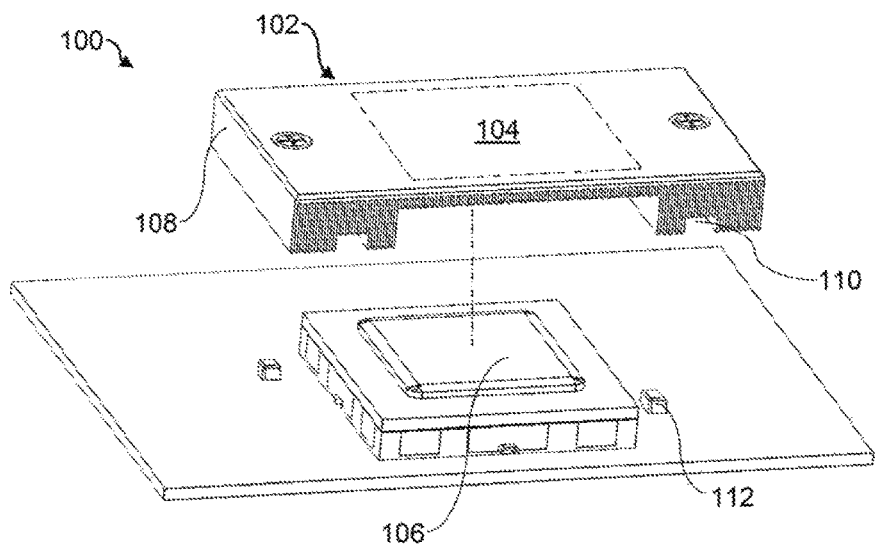
FIG. 1C is a perspective exploded view of an example heat exchanger system having an example heat exchanger.
Figure 1D:
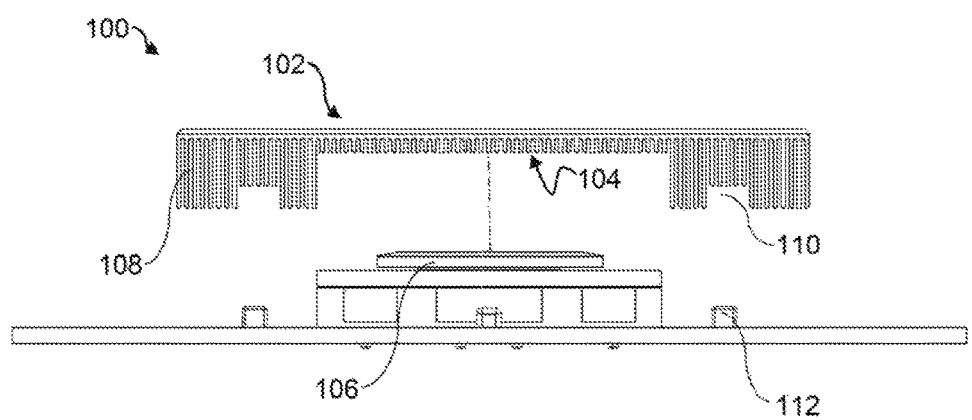
FIG. 1D is a front exploded view of an example heat exchanger system having an example heat exchanger.

Referring additionally to FIGS. 1C-D, a perspective exploded view, and a front exploded view of an example heat exchanger system 100 is illustrated. The example heat exchanger 102 may further comprise an auxiliary fluid channel 110. The auxiliary fluid channel 110 may be disposed within the plurality of fins 108, in some implementations. Further, the auxiliary fluid channel 110 may be a cutout extending through the plurality of fins 108, and may further be defined by, e.g., cut out of some of the plurality of fins 108 at an end of the fins opposite from the base 104. It should be noted that the base 104, as it is illustrated in FIGS. 1C-D, may be a substantially flat surface on the underside of the heat exchanger 102, disposed behind the visible fins, in some implementations. In further implementations, the auxiliary fluid channel 110 may be sized to accommodate or provide clearance for an electrical or electronic component 112, other than the computing component, disposed within the auxiliary fluid channel 110. The auxiliary fluid channel 110 may provide sufficient clearance for the electronic component 112 such that the electronic component 112 does not mechanically interfere with any of the plurality of fins 108. The auxiliary fluid channel 110 may facilitate the transfer of thermal energy from the electronic component within the channel to a fluid medium within the channel or flowing within the auxiliary fluid channel 110. In further implementations, the auxiliary fluid channel 110 may be constructed such that a fluid medium may flow into the channel at a first end, on a first side of the heat exchanger 102, and flow through the channel, over or across the electronic component 112, and out of the channel at a second end, on a second, opposite side of the heat exchanger 102. Additionally, in further implementations, the plurality of fins 108 includes fins having different lengths, such that the different lengths of the fins 108 define a fin profile along an end of the plurality of fins 108 opposite from the base, wherein the fin profile defines the auxiliary fluid channel 110. The auxiliary fluid channel 110 may be defined, in some implementations, by fins of the plurality of fins 108 having a length shorter than the length of the fins adjacent to the auxiliary fluid channel 110.

Figure 2:
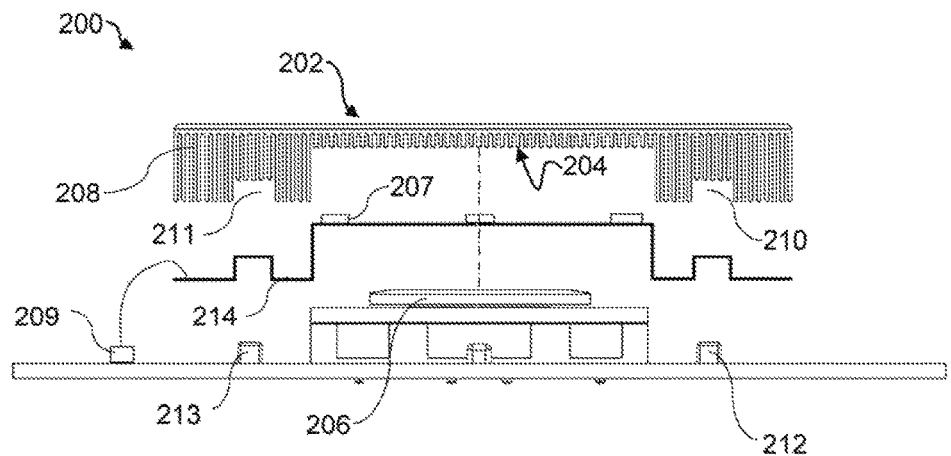
FIG. 2 is a front exploded view of an example heat exchanger system having an example heat exchanger.

Referring now to FIG. 2, a front exploded view of an example heat exchanger system 200 is illustrated. The example heat exchanger system 200 may include an example heat exchanger 202. Example heat exchanger system 200, and example heat exchanger 202, may be similar to example heat exchanger system 100 and example heat exchanger 102, respectively. Further, the similarly named elements of example heat exchanger system 200 may be similar in function and/or structure to the elements of example heat exchanger system 100, as they are described above. Example heat exchanger 202 may have thermally conductive engagement with a computing component 206, through a base 204 of the heat exchanger 202. The example heat exchanger 202 may include an auxiliary fluid channel 210, as well as a second auxiliary fluid channel 211, which may be similar in function and structure to auxiliary fluid channel 210. Each of the auxiliary fluid channel 210 and the second auxiliary fluid channel 211 may be defined by a plurality of fins 208 of the example heat exchanger 202, and may also facilitate the transfer of thermal energy from electronic components 212 and 213 disposed within the auxiliary fluid channel 210 and the second auxiliary fluid channel 211, respectively. In some implementations, the example heat exchanger 202 may comprise additional auxiliary fluid channels, not shown in FIG. 2, which may be similar to channels 210 and 211, and which may also comprise an electronic component disposed within.

Further, the example heat exchanger system 200 may include a thermal barrier 214. The thermal barrier 214 may be constructed of a non-conductive material, or a material that is less conductive than the material that the heat exchanger 202, or the plurality of fins 208 thereon, comprises. Further, the thermal barrier 214 may be contoured, or substantially follow a fin profile of the plurality of fins 208 of the example heat exchanger 202. As such, the thermal barrier 214 may be disposed within the auxiliary fluid channel 210, and/or the second auxiliary channel 211 or any additional auxiliary fluid channels. The thermal barrier 214 may be disposed within the fluid channels such that the thermal barrier 214 is disposed in between the plurality of fins 208 defining such fluid channels, and the electronic components within the fluid channels. Further, the thermal barrier 214 may be disposed within the auxiliary fluid channels such that the thermal barrier covers the entire length of the channels, or a portion thereof.

Additionally, the thermal barrier 214 may not be disposed in between the heat exchanger 202 and the computing component 206, or the thermal barrier 214 may have a cutout or window around the computing component 206, such that the heat exchanger 202 may still transfer thermal energy from the computing component 206 to the plurality of fins 208 of the heat exchanger 202. The thermal barrier 214 may, however, inhibit the transfer of thermal energy from the plurality of fins 208 to the electronic components disposed within the auxiliary fluid channels. This inhibition of heat transfer to the electronic components may prevent the plurality of fins 208 from transferring thermal energy which may detrimentally affect the performance of such electronic components. In other words, the thermal barrier 214 may not inhibit the transfer of thermal energy from the computer component 206 to the heat exchanger 202, but it may protect the electronic components disposed within the auxiliary fluid channels from the heat of the plurality of fins 208.

In some implementations, the example heat exchanger system 200 may include one or multiple thermal sensors 207. The thermal sensors 207 may be disposed on the thermal barrier 214, and may monitor and communicate the temperature of the thermal barrier, the computing component 206, or the example heat exchanger 202 to the computing system through a connector 209 on a system board. In further implementations, the thermal sensor or sensors 207 may be disposed elsewhere and may monitor the temperature of other components.

Figure 3A:
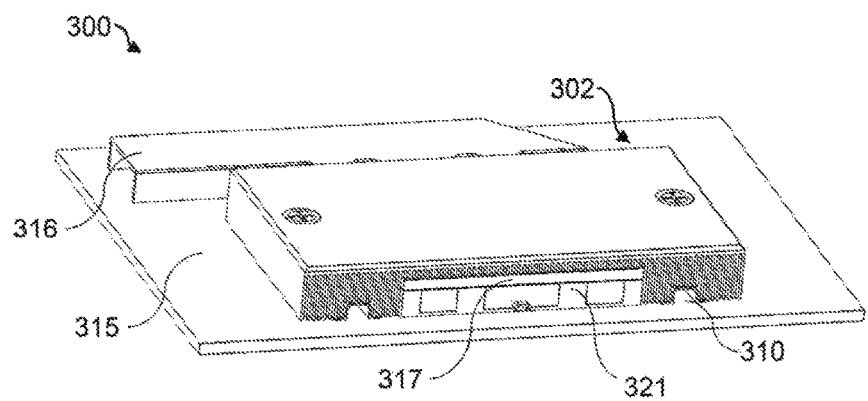
FIG. 3A is a perspective view of an example heat exchanger system having an example heat exchanger.
Figure 3B:
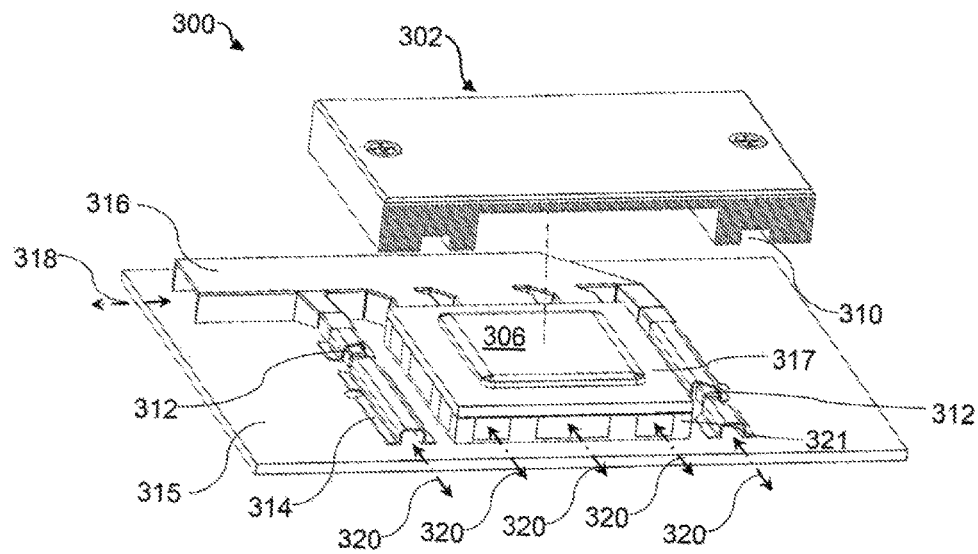
FIG. 3B is a perspective exploded view of an example heat exchanger system having an example heat exchanger.
Figure 3C:
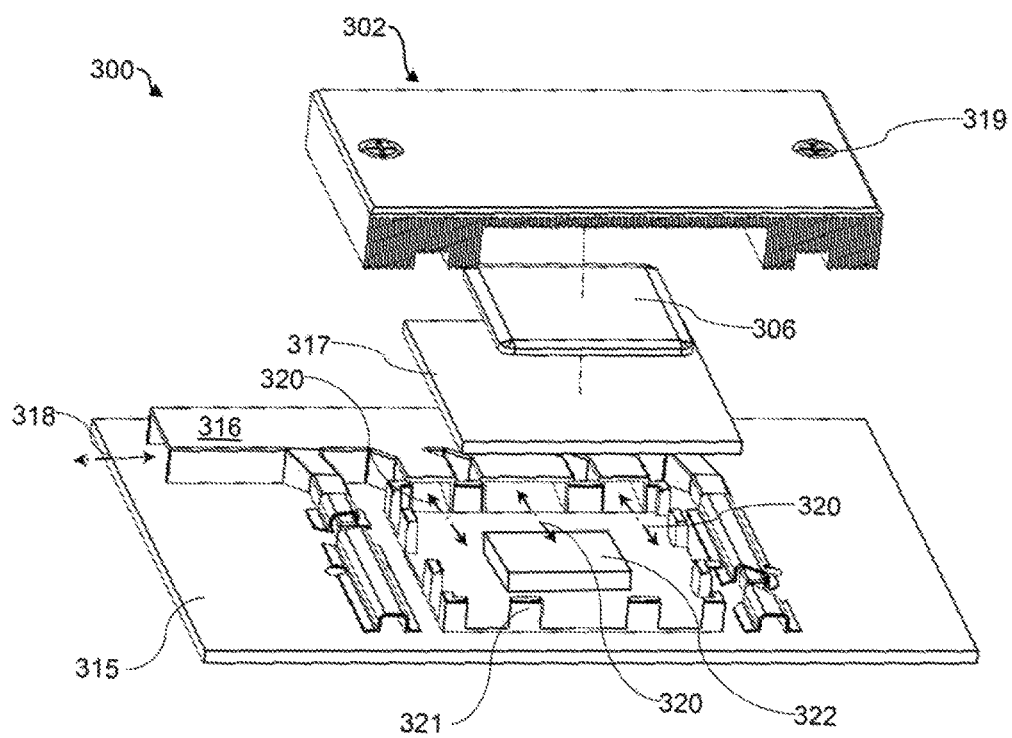
FIG. 3C is a perspective exploded view of an example heat exchanger system having an example heat exchanger.

Referring now to FIGS. 3A-C, a perspective view, and perspective exploded views of an example heat exchanger system 300 is illustrated. Example heat exchanger system 300, may be similar to example heat exchanger system 100 or 200. Further, the similarly named elements of example heat exchanger system 300 may be similar in function and/or structure to the elements of example heat exchanger system 100 or 200, as they are described above. Heat exchanger system 300 may include an example heat exchanger 302, a first system board 315, and a second system board 317. The heat exchanger system 300 may further include a computing component 306 disposed on the second system board and conductively engaged with the example heat exchanger 302.

The first system board 315 may structurally support and electrically connect multiple electronic or computer components. The first system board 315 may, in some implementations, electrically connect multiple electronic components with conductive pathways. In further implementations, the first system board 315 may be substantially constructed of a non-conductive substrate with conductive pathways embedded within the substrate. In some implementations, the non-conductive substrate may include silicon, and/or may be flexible. In some implementations, the first system board 315 might comprise a single-layer rigid printed circuit board (PCB), or a multi-layer rigid PCB in other implementations. In some implementations, conductive pathways may be comprise copper, such as copper traces or copper wires, for example. In other implementations, conductive pathways may comprise carbon nanomaterials, such as carbon nanotubes (CNT) or carbon nanowires (CNW).

The second system board 317 may be similar in function and/or structure to the first system board 315, in some implementations. The second system board 317 may electrically engage the computing component 306 with other electronic components in the computing system. In some implementations, the second system board 317 may engage the computing component 306 with optical components 322 disposed on the first system board 315, such as optical transceivers, for example. In further implementations, the second system board 317 may be spaced apart from, and substantially parallel to the first system board 315. The second system board 317 may be spaced apart from the first system board 315 along a first direction, with the first direction substantially perpendicular to the first and second system boards, in some implementations. The second system board 317 may be mechanically engaged with the first system board 315 by a mezzanine-style connector, or, in other words, a connector that may fix the second system board 317 in a spaced-apart, but parallel configuration, relative to the first system board 315. Thus, the second system board 317 may space the computing component 306 apart from the first system board 315. In some implementations, other electronic or optical components 322, such as optical transceivers, for example, may be disposed within the mezzanine-style connector, in between the first and second system boards, or some or all of the electrical or optical components 322 may be disposed on the underside of the second system board 317.

The example heat exchanger 302 may include a base having thermally conductive engagement with the computing component 306, as well as a plurality of fins extending from the base, on the same side as the computing component 306, towards the first system board 315. The plurality of fins may extend around the second system board 317, as well as the computing component 306 and the mezzanine-style connector, and towards the first system board 315, as illustrated in FIGS. 3A-C. Additionally, the example heat exchanger system 300 may include a thermal barrier 314 disposed in between the plurality of fins and the first system board 315. The thermal barrier 314 may be contoured to follow a fin profile of the plurality of fins, and further be disposed within one or more auxiliary fluid channels 310 of the example heat exchanger 302. The thermal barrier 314 may be disposed within at least one auxiliary fluid channel 310 such that the thermal barrier 314 is disposed in between the plurality of fins and electronic components 312 disposed on the first system board 315 within the auxiliary fluid channel 310, and, as such, the thermal barrier 314 may prevent the transfer of thermal energy from the plurality of fins and the electronic components 312.

In some implementations, as previously shown in FIG. 2 but not shown in FIGS. 3A-C, the thermal barrier 314 may be disposed in between the example heat exchanger 302 and the second system board 317. In such an implementation, the computing component 306 may extend through the thermal barrier 314 such that the computing component 306 is still conductively engaged with the heat exchanger 302 and the heat exchanger 302 may still transfer thermal energy from the computing component 306 to the plurality of fins. In some implementations, the thermal barrier 314 may include a cutout or window that may be sized sufficiently such that the computing component 306 may extend through the thermal barrier 314 through such a window or cutout.

In further implementations, the thermal barrier 314 may comprise one or more smaller sections that may only be disposed within the one or more auxiliary fluid channels 310, as is illustrated in FIG. 3B. In such implementations, the smaller sections of thermal barrier 314 may only be sufficiently sized to be disposed between the plurality of fins and electronic components 312 so as to prevent or inhibit the transfer of thermal energy from the plurality of fins to the electronic components 312. Further, in such implementations, the thermal barrier may not be disposed in between the example heat exchanger 302 and the second system board 317. It should be noted that, in FIGS. 3B-C, the smaller sections of thermal barrier 314 are illustrated with a cutout in order to show the electronic components 312 underneath the thermal barrier sections.

The example heat exchanger system 300, in some implementations, may have a fluid duct 316 engaged with the heat exchanger 302. The fluid duct 316 may be a rigid or semi-rigid structure capable of receiving and directing the flow of a fluid medium. The fluid medium may be a gaseous medium, or a liquid medium, in some implementations. The fluid duct 316 may receive a flow 318 of a fluid medium and comprise one or more redirecting channels, such that the duct may redirect the flow 318 into one or more fluid flows 320. The fluid flows 320 may be directed through one or more auxiliary fluid channels 310, and, in some implementations, be directed through the thermal barrier 314. Each fluid flow 320 may receive and remove thermal energy from electronic components 312, such that the fluid flow 320 lowers or regulates the temperature of such electronic components 312. In further implementations, the fluid duct 316 may redirect the fluid flow 318 through the mezzanine-style connector 321. In such an implementation, the fluid flows 320 may receive and remove thermal energy from one or more electronic or optical components 322 within the mezzanine-style connector 321. The fluid flow 320, after receiving thermal energy from the components 322, may be exhausted through openings in the mezzanine-style connector 321.

In some implementations, the example heat exchanger system 300 may also include at least one retention feature 319 to retain the heat exchanger 302 to the first system board 315 such that the heat exchanger 302 maintains thermally conductive engagement with the computing component 306. The retention feature 319 may be a mechanical retention feature, such as a screw, bolt, pin, or other component suitable to retain the heat exchanger 302. In some implementations, the retention feature 319 may retain the heat exchanger 302 to the second system board 317, or another structural component within the computing system, other than the first or second system boards 315 and 317, such that the heat exchanger 302 maintains thermally conductive engagement with the computing component 306.

What is claimed is:

1. A heat exchanger, comprising:
   a base to thermally conductively engage with a computing component;
   a plurality of fins extending from the base on the same side as the computing component, the plurality of fins to transfer thermal energy from the computing component to a fluid medium surrounding the plurality of fins, wherein the plurality of fins includes fins having different lengths such that the different lengths of the fins define a fin profile along an end of the plurality of fins opposite from the base;
   an auxiliary fluid channel defined by the plurality of fins fin profile, wherein the auxiliary fluid channel is to facilitate the transfer of thermal energy from an electronic component, other than the computing component, disposed within the auxiliary fluid channel to a fluid medium flowing through the auxiliary fluid channel, and wherein the auxiliary fluid channel is defined by fins having a length shorter than the length of the fins adjacent to the auxiliary fluid channel; and
   a thermal barrier disposed along the fin profile defined by the plurality fins, wherein the thermal barrier is contoured to follow the fin profile to define the auxiliary fluid channel and a second auxiliary fluid channel, and wherein the thermal barrier inhibits the transfer of thermal energy from the plurality of fins through the thermal barrier.

2. The heat exchanger of claim 1, wherein the fin profile of the plurality of fins defines the second auxiliary fluid channel that extends through the plurality of fins, wherein the second auxiliary fluid channel is to facilitate the transfer of thermal energy from an electronic component, other than the computing component, disposed within the second auxiliary fluid channel to a fluid medium flowing through the second auxiliary fluid channel.

3. The heat exchanger of claim 2, further comprising at least one retention feature to retain the heat exchanger to a system board such that the heat exchanger maintains conductive engagement with the computing component.

4. A heat exchanger system, comprising:
   a first system board;
   a computing component disposed on a second system board, the second system board spaced apart from the first system board along a first direction perpendicular to the first and second system boards; and
   a heat exchanger including:
      a base to thermally conductively engage with the computing component;
      a plurality of fins that extend from the base on the same side as the computing component, such that the fins extend towards the first system board;
      an auxiliary fluid channel defined by the plurality of fins,
      wherein the auxiliary fluid channel is to facilitate the transfer of thermal energy from an electronic component, other than the computing component, disposed within the auxiliary fluid channel to a fluid medium flowing through the auxiliary fluid channel; and
      a thermal barrier disposed in between the plurality of fins and the first system board, wherein the thermal barrier is contoured to follow the fin profile of the plurality of fins.

5. The heat exchanger system of claim 4, wherein the thermal barrier is disposed in between the heat exchanger and the second system board, wherein the computing component extends through the thermal barrier such that the computer component is thermally conductively engaged with the heat exchanger.

6. The heat exchanger system of claim 5, wherein the second system board is engaged with the first system board through a mezzanine connector, such that the second system board is spaced apart from the first system board along the first direction by the mezzanine connector.

7. The heat exchanger system of claim 6, further comprising a fluid duct to direct a flow of a fluid medium through the auxiliary fluid channel such that the fluid medium receives and removes thermal energy from the electronic component within the auxiliary fluid channel.

8. The heat exchanger system of claim 7, wherein the computing component is engaged with at least one optical component disposed in between the first and second system boards, within the mezzanine connector.

9. A heat exchanger system, comprising:
a first system board including at least one electronic component and a mezzanine connector;
a second system board including a computer component, wherein the second system board is spaced apart from and engaged with the first system board through the mezzanine connector;
a heat exchanger including a base to thermally conductively engage with the computing component, and a plurality of fins that extend from the base on the same side as the computing component such that the fins extend towards the first system board,
wherein the plurality of fins comprise fins of differing lengths such that an end of the plurality of fins defines a fin profile having an auxiliary fluid channel, and
wherein the auxiliary fluid channel is sized sufficiently to provide clearance for the at least one electronic component disposed on the first system board such that the electronic component does not mechanically interfere with any of the plurality of fins;
a fluid duct to direct a fluid medium past the plurality of fins and separately through the auxiliary fluid channel of the heat exchanger, such that the fluid medium receives thermal energy from the computing component through the plurality of fins, and further receives thermal energy from the electronic component, wherein the fluid duct further directs a fluid medium through the mezzanine connector, such that thermal energy is transferred from an optical component within the mezzanine connector and transferred to the fluid medium.

* * * * *